(12) United States Patent
Angelos

(10) Patent No.: US 7,358,727 B1
(45) Date of Patent: Apr. 15, 2008

(54) TRUNCATED MR IMAGING WITH FRACTIONAL READOUT FOV USEFUL FOR BREAST AND SPINE IMAGING

(75) Inventor: Elisabeth C. Angelos, Hartland, WI (US)

(73) Assignee: General Electric Company, Schenectady, NY (US)

( * ) Notice: Subject to any disclaimer, the term of this patent is extended or adjusted under 35 U.S.C. 154(b) by 437 days.

(21) Appl. No.: 10/710,774

(22) Filed: Aug. 2, 2004

(51) Int. Cl.
*G01V 3/00* (2006.01)

(52) U.S. Cl. .................................. 324/307

(58) Field of Classification Search ........ 324/300–322; 600/410–435
See application file for complete search history.

(56) References Cited

U.S. PATENT DOCUMENTS 6,489,766 B1 * 12/2002 Alsop ..................... 324/313
6,876,199 B2 * 4/2005 Hardy et al. ............ 324/309

OTHER PUBLICATIONS

C.J. Hardy et al., "Large Field-of-View Real-Time MRI with a 32-Channel System," MRM 52:878-884 (2004).

\* cited by examiner

*Primary Examiner*—Brij Shrivastav
*Assistant Examiner*—Dixomara Vargas
(74) *Attorney, Agent, or Firm*—Ziolkowski Patent Solutions Group, SC

(57) ABSTRACT

A method and system for MR imaging are disclosed that include a fractional readout FOV to provide flexibility in scan volume prescription as well as reduce scan artifacts typically associated with uninteresting anatomy. The fractional readout FOV is defined by a frequency encode dimension smaller than the phase encode dimension.

19 Claims, 3 Drawing Sheets

US 7,358,727 B1

TRUNCATED MR IMAGING WITH FRACTIONAL READOUT FOV USEFUL FOR BREAST AND SPINE IMAGING

BACKGROUND OF INVENTION

The present invention relates generally to MR imaging and, more particularly, to a method and system of MR data acquisition with fractional readout field of view (FOV) to truncate noisy and artifact producing regions.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$ may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Generally, in MR imaging, the phase encode dimension of an FOV is sized to be equal to or smaller than the frequency encode dimension of the FOV. An FOV with a smaller phase encoding dimension is typically referred to as a "fractional phase encoding FOV". A fractional phase encoding FOV is commonly used when prescribing an MR scan to improve the efficiency of the MR scan. That is, by defining the FOV to be dimensionally smaller in the phase encode direction, fewer phase encoding steps are generally required to image the FOV. However, constraints such as artifact suppression or parallel imaging requirements related to coil geometry can affect the desired phase encode direction and, as such, force an increase in the scan FOV. One skilled in the art will appreciate that an increase in scan FOV, i.e. a larger FOV than desired, decreases spatial resolution and increases the likelihood that the scan volume includes artifact-prone regions of "uninteresting" anatomy. In this regard, the scan efficiency benefits associated with the fractional phase encode FOV are reduced—if not lost.

The imaging of non-relevant or "uninteresting" anatomy refers to the acquisition of data from regions of a subject that are outside the targeted region of interest. For example, bilateral breast scans are frequently done with an axial slab. Since frequency needs to be along the anterior/posterior (A/P) direction to eliminate/reduce artifacts from cardiac motion, axial bilateral breast scans require a relatively large FOV to spatially include both breasts. To cover both breasts, the scan volume invariably includes much of the chest region which is not generally of interest for a bilateral breast scan. In fact, the inclusion of the chest region in the FOV can then degrade spatial resolution in the frequency encode (A/P) direction and add motion artifacts. Furthermore, due to the limited region of breast coil sensitivity, the chest part of the images can be noisy and suffer from artifacts in parallel imaging scans.

A similar drawback can occur in sagittal spine imaging where the desired frequency encoding direction is along the A/P axis of the subject. The desired coverage in the phase encoding direction yields an FOV that includes uninteresting anatomy in the frequency encoding direction. Furthermore, with a coil designed to image the spine, regions far from the coil in the reconstructed image can be relatively noisy and artifact-prone, including artifacts introduced by processing noise with a surface coil intensity correction.

It would therefore be desirable to have a system and method capable of defining an FOV that limits spatial coverage of uninteresting anatomy with reduced noise and artifact susceptibility.

BRIEF DESCRIPTION OF INVENTION

The present invention provides a system and method of limiting spatial coverage to targeted regions of interest that overcomes the aforementioned drawbacks.

An imaging technique and system for carrying the technique are disclosed that includes fractional readout FOV to provide flexibility in scan volume prescription as well as reduce scan artifacts typically associated with uninteresting anatomy. The fractional readout FOV is defined by a frequency encode dimension smaller than the phase encode dimension. In this regard, the present invention tailors, or localizes, the FOV to an anatomical region of interest. Moreover, the invention reduces, if not avoids, the reliance on post-processing filtering or matting of the image to remove noisy and uninteresting regions from the mage.

Therefore, in accordance with one aspect of the present invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to acquire MR data from an FOV that is smaller in a frequency encode direction than in a phase encode direction.

In accordance with another aspect of the invention, a method of MR imaging includes defining an FOV to have a phase encoding dimension and a frequency encoding dimension, wherein the frequency encoding dimension is less than the phase encoding dimension. The method also includes acquiring MR data from the FOV for image reconstruction.

In accordance with another aspect of the invention, the invention is embodied in a computer program stored on a computer readable storage medium and having instructions which, when executed by a computer, cause the computer to apply a slice select gradient to spatially define an FOV in a first direction. The computer is also caused to apply a phase encoding gradient to phase encode the FOV in a second direction. The computer is further caused to apply a frequency encoding gradient to frequency encode the FOV in a third direction, the frequency encoding gradient being designed to spatially define the FOV smaller in the third direction than in the second direction.

In accordance with yet another aspect, a breast imaging examination technique includes selecting an FOV sized to spatially include both breasts of a subject to be scanned. The technique also includes truncating the FOV in a frequency encoding direction such that the FOV is larger in a phase encoding direction than the frequency encoding direction and acquiring MR data from the truncated FOV.

According to another aspect, a spinal imaging examination technique includes selecting a sagittal FOV sized to spatially include multiple spinal regions of a subject to be scanned. The technique also includes truncating the FOV in a frequency encoding direction such that the FOV is larger in a phase encoding direction than the frequency encoding direction and acquiring MR data from the truncated FOV.

Various other features, objects, and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
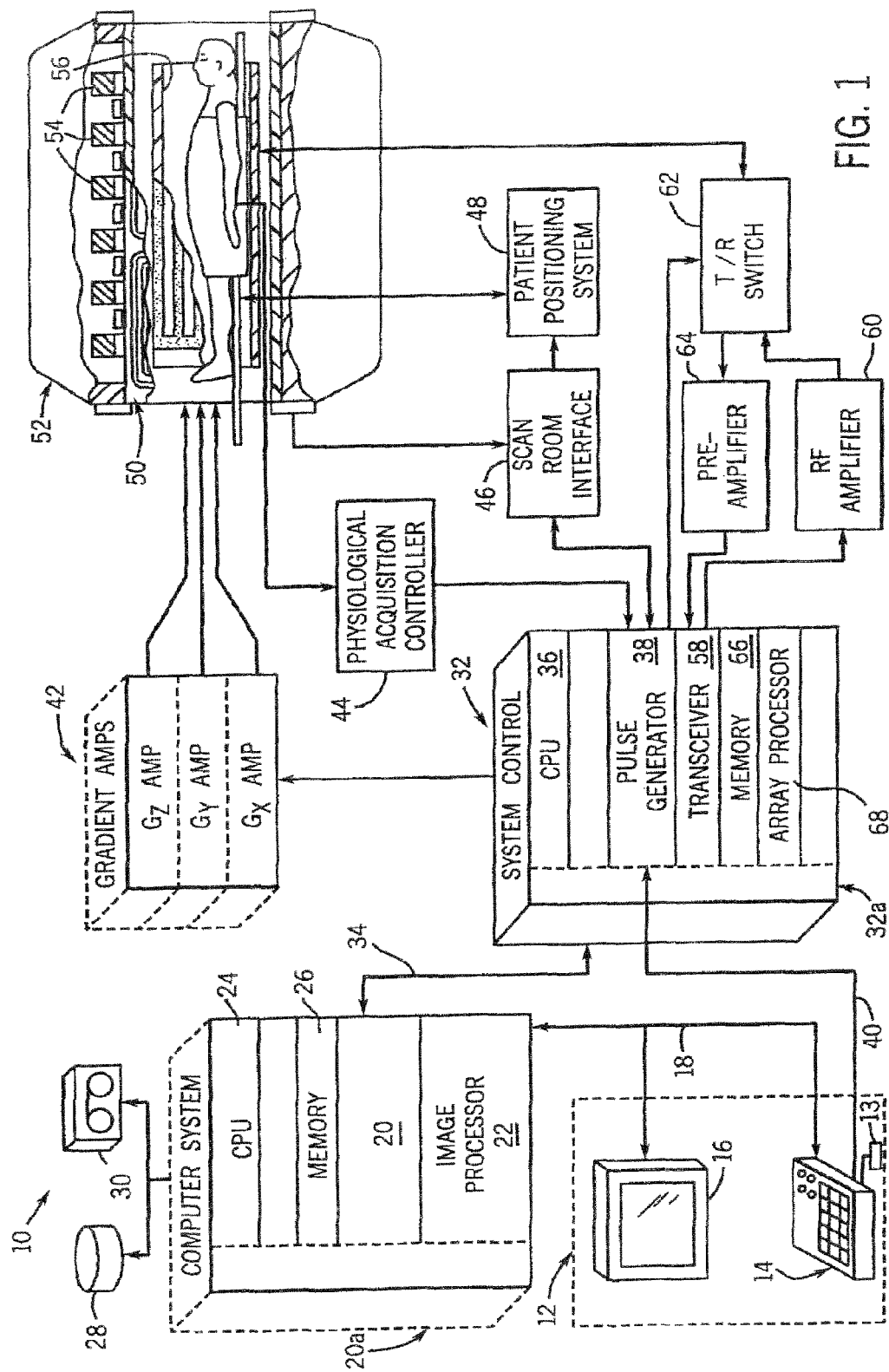
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode. The MR system may also be equipped with a phased array coil arrangement for parallel imaging.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention includes a method and system suitable for use with the above-referenced MR system, or any similar or equivalent system for acquiring MR images.

The present invention is directed to a method and system of MR data acquisition with fractional readout FOV. In this regard, the FOV is defined to be shorter along its frequency encode dimension than its phase encode dimension. Shaping the FOV in this manner enables flexible scan volume prescription, higher spatial resolution, and noise and artifact reduction from uninteresting, or irrelevant, regions of the scan volume. In the context of a bilateral breast scan, fractional readout FOV allows for removal of uninteresting portions of the chest region from the imaging volume. As a result, the typically noise-inducing chest regions are removed from the image. Further in the context of bilateral breast acquisition, the present invention improves the performance of parallel imaging techniques by reducing, if not eliminating, regions with relatively low coil sensitivity which have been shown to be difficult to reconstruct with good image quality.

One skilled in the art will appreciate that bilateral breast scans illustrate but one clinical application to which the present invention may be applied. Accordingly, the present invention is also applicable with a number of other clinical applications including, but not limited to sagittal spine imaging. Fractional readout FOV in the context of sagittal spine imaging also allows for the removal of uninteresting anatomical regions, such as the chest volume from the imaging volume which can produce motion artifacts. The present invention also improves the performance of surface coil intensity correction algorithms by reducing, if not eliminating, relatively noisy regions from the image volume that are difficult to process. Additionally and more generally, application of the present invention reduces the need for post-processing of images to reduce noisy and/or uninteresting regions from the images. In this regard, the present invention does not require post-processing filtering of images for noise reduction or the use of image matting.

Figure 2:
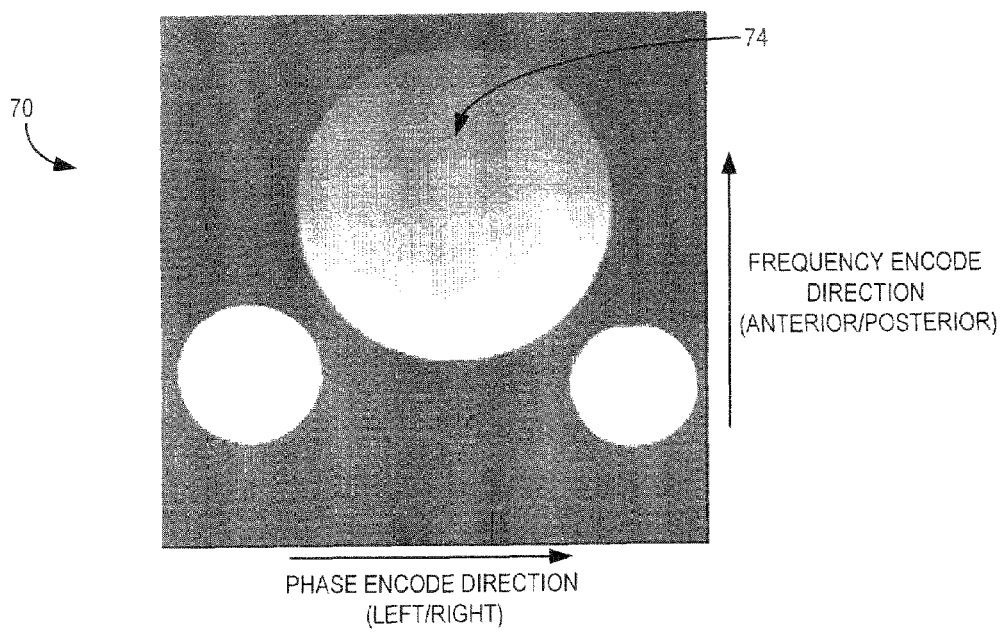
FIG. 2 is an axial bilateral breast phantom image reconstructed from MR data acquired with known parallel imaging techniques in a symmetrical FOV.
Figure 3:
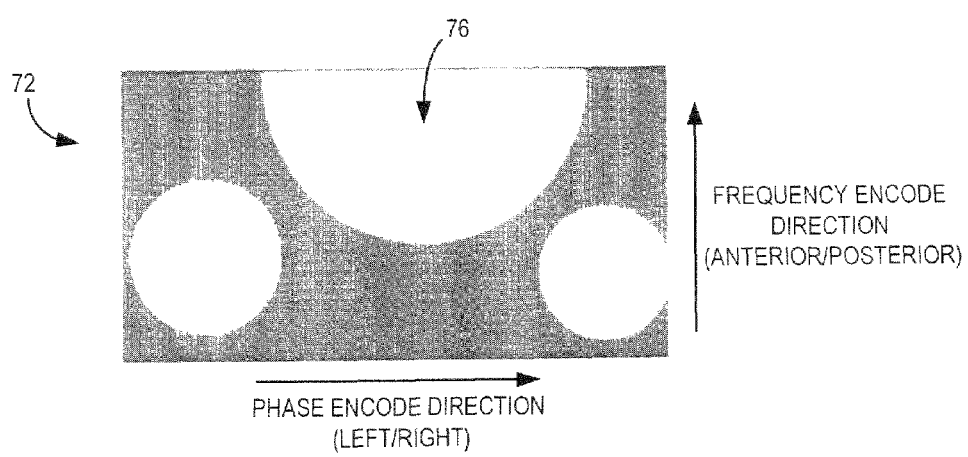
FIG. 3 is an axial bilateral breast phantom image reconstructed from MR data acquired with known parallel imaging techniques, but with fractional FOV in the readout direction according to the present invention.

Referring now to FIGS. 2 and 3, respectively, an exemplary axial bilateral breast phantom image reconstructed from MR data acquired with known parallel imaging techniques and a symmetrical FOV, and an axial bilateral breast phantom image reconstructed from MR data acquired with known parallel imaging techniques and fractional FOV in the readout direction are shown. Both images are oriented such that the respective FOVs 70, 72 are defined by a frequency encode dimension that extends along an A/P direction and a phase encode dimension that extends along a lateral (left-to-right) direction. FOV 70 is a square FOV where the ratio of frequency encode FOV to the phase encode FOV is equal to one. Moreover, the size of FOV 70 is set by the left/right size of the two-breast volume. On the other hand, since FOV 72 is dimensionally smaller in the readout direction, the corresponding ratio of frequency encode FOV to phase encode FOV for FOV 72 is less than one.

In bilateral breast exams, the frequency encoding or readout direction is typically selected along the A/P axis of the patient to reduce artifacts from cardiac motion when taking an axial image. However, as shown and referenced above, the length of the frequency encode dimension of FOV 72 is shorter than the frequency encode dimension of FOV 70. In this regard, the ghosting in the phantom chest region 74 within FOV 70 is not included in the acquisition of the phantom chest region 76 within FOV 72. In the context of a bilateral breast acquisition, an axial image will contain uninteresting anatomy (the chest region) which is noise-inducing and artifact-prone due to low coil sensitivity in this region. Accordingly, with fractional readout FOV or fractional FOV in the frequency encode direction, the scan volume can spatially focus on the interesting or target anatomy more efficiently and eliminate the uninteresting region having higher noise and artifacts. In this regard, an otherwise distracting noisy region is removed from the image. It should also be noted that protocols can be designed so that clarity of the breasts regions is not lost with fractional readout FOV.

Figure 4:
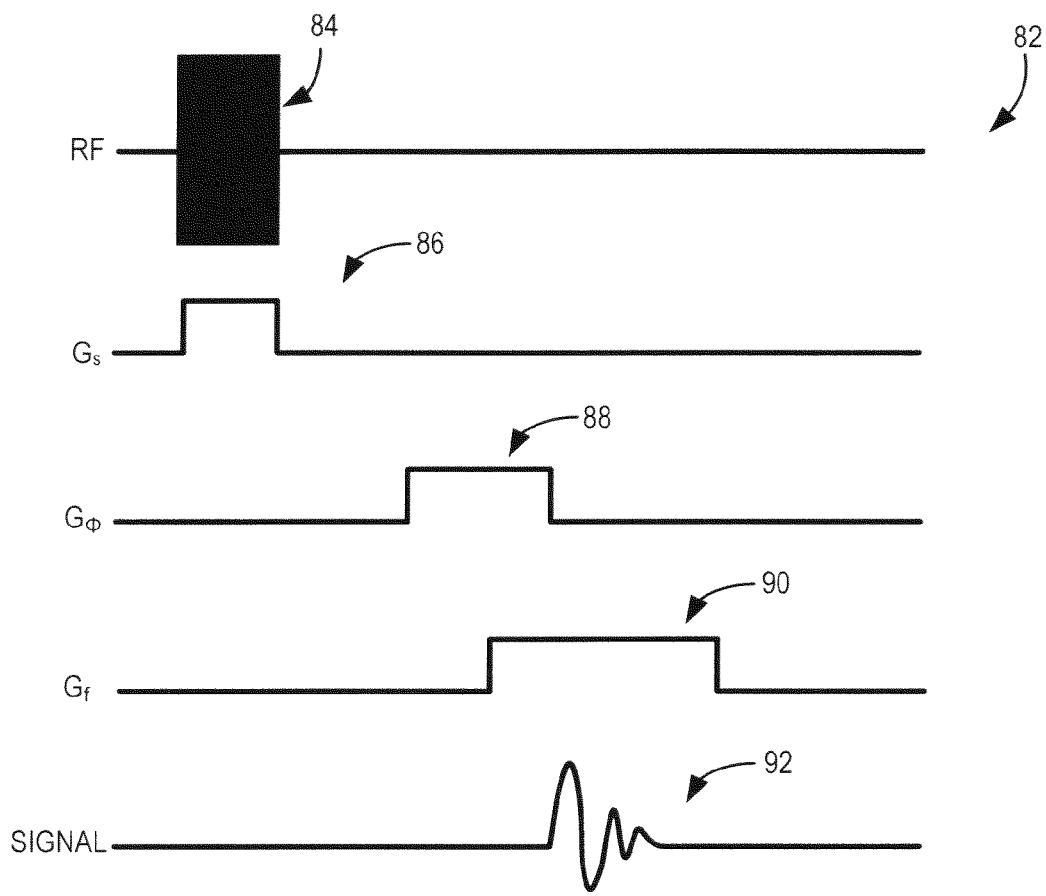
FIG. 4 is a graphical representation of a pulse sequence/data acquisition with fractional readout FOV according to the present invention.

It is contemplated that a number of techniques may be carried out to achieve fractional FOV in the frequency encode direction. One such technique is illustrated in a simplified pulse sequence/data acquisition 82 graphically shown in FIG. 4. Pulse sequence is defined by an initial RF pulse 84 that is slice selective for a region of interest. Generally, the RF pulse will have a flip angle of 90 degrees and is an apodized sinc function shaped burst of RF energy. A slice selection gradient 86 is played out at the same time as RF pulse 84. Once the RF pulse is complete, the slice selection gradient 86 is turned off and a phase encoding gradient pulse 88 is applied. The phase encoding gradient is used to impart a specific phase angle to the transverse magnetization in spins occurring as a result of the selective RF pulse 84. When the phase encoding gradient pulse 88 is turned off, a frequency encoding gradient pulse 90 is applied during the data acquisition of echo 92. The frequency encoding gradient causes spin packets to precess at rates depending upon their position in the frequency encoding direction. As result, each of the spins has a unique phase angle and precessional frequency. This data will be used in the filling of k-space when sampling echo 92.

The acquired data is filtered (band limited) to eliminate frequencies outside of a predetermined range (the readout bandwidth). Increasing the frequency encoding gradient field strength causes the range of measured readout frequencies to come from a smaller spatial dimension (the frequency encode, or readout, FOV). By decreasing the FOV in the frequency direction without changing the phase encode gradients, the frequency encoding FOV will be fractional relative to the phase encoding FOV. Alternatively, the phase encoding FOV may be increased by implementing a larger number of smaller phase encoding pulses. In this regard, the phase encoding FOV will be spatially larger than the frequency, or readout, FOV. As such, the FOV will be fractional in the direction of readout relative to the direction of phase encoding. This is particularly advantageous to spatially define a scan volume to be more targeted to a region of interest during MR scans, such as axial bilateral breast and sagittal spine scans.

The present invention is applicable with spin echo and gradient recalled echo segments as well as fast and multi-slice/multi-echo derivatives thereof. The present invention is also applicable with sequential, centric, reverse centric, and the like k-space filling schemes. Additionally, the present invention is applicable with MR scanners having phased array or surface coils. In this regard, it is recognized that a surface coil intensity correction may be carried out in a known manner.

Therefore, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to acquire MR data from an FOV that is smaller in a frequency encode direction than in a phase encode direction.

A method of MR imaging is disclosed and includes defining an FOV to have a phase encoding dimension and a frequency encoding dimension, wherein the frequency encoding dimension is less than the phase encoding dimension. The method also includes acquiring MR data from the FOV for image reconstruction.

The invention may also be embodied in a computer program stored on a computer readable storage medium and having instructions which, when executed by a computer, cause the computer to apply a slice select gradient to spatially define an FOV in a first direction. The computer is also caused to apply a phase encoding gradient to phase encode the FOV in a second direction. The computer is further caused to apply a frequency encoding gradient to frequency encode the FOV in a third direction, the frequency encoding gradient being designed to spatially define the FOV smaller in the third direction than in the second direction.

A breast imaging examination technique is presented and includes selecting an FOV sized to spatially include both breasts of a subject to be scanned. The technique also includes truncating the FOV in a frequency encoding direction such that the FOV is larger in a phase encoding direction than the frequency encoding direction and acquiring MR data from the truncated FOV.

A spinal imaging examination technique is also presented and includes selecting a sagittal FOV sized to spatially include multiple spinal regions of a subject to be scanned. The technique also includes truncating the FOV in a frequency encoding direction such that the FOV is larger in a phase encoding direction than the frequency encoding direction and acquiring MR data from the truncated FOV.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
   a computer programmed to acquire MR data from a field of view (FOV) that is smaller in a frequency encode direction than in a phase encode direction and programmed to define the FOV such that the frequency encode direction extends parallel to an anterior/posterior axis extending through the bore.

2. The MR apparatus of claim 1 wherein the computer is further programmed to cause application of a phase encoding gradient and a frequency encoding gradient, and wherein the frequency encoding gradient is designed to cause a range of measured readout frequencies to come from a smaller spatial dimension than that defined by the phase encoding gradient.

3. The MR apparatus of claim 2 wherein the computer is further programmed to dimensionally define the FOV from a left/right size of a two-breast volume.

4. The MR apparatus of claim 3 wherein the computer is further programmed to reconstruct a bilateral image of a breast region of a subject along a generally axial plane.

5. The MR apparatus of claim 3 wherein the computer is further programmed to define readout in a direction to reduce artifacts resulting from cardiac motion during an axial bilateral breast scan.

6. The MR apparatus of claim 1 wherein the computer is further programmed to define readout in a direction to reduce artifacts from CSF pulsation during a sagittal spine scan.

7. The MR apparatus of claim 1 wherein the RF coil assembly includes at least a phased array coil architecture or a surface coil.

8. A method of MR imaging comprising the steps of:
   defining an FOV to have a phase encoding dimension and a frequency encoding dimension, wherein the frequency encoding dimension is less than the phase encode dimension, and wherein the frequency encode dimension is parallel to an anterior/posterior axis extending through a subject to be scanned; and
   acquiring MR data from the FOV for image reconstruction.

9. The method of claim 8 wherein the frequency encode dimension is transverse to the phase encode dimension.

10. The method of claim 8 wherein the step of acquiring MR data includes the acquisition of bilateral breast data from a patient along an axial plane of orientation.

11. The method of claim 8 wherein the step of acquiring MR data includes the acquisition of spine data from a patient along a sagittal plane of orientation.

12. The method of claim 8 wherein the step of acquiring includes acquiring MR data with a phased array coil spatially sensitive to the FOV.

13. A computer readable storage medium having a computer program stored thereon and representing a set of instructions that when executed by a computer causes the computer to:
   apply a slice select gradient to spatially define an FOV in a first direction;
   apply a phase encoding gradient to phase encode the FOV in a second direction;
   apply a frequency encoding gradient to frequency encode the FOV in a third direction, the frequency encoding gradient designed to spatially define the FOV smaller in the third direction than in the second direction; and
   acquire MR data from the FOV with readout in the third direction which is parallel to an anterior/posterior axis through a subject; and
   store the acquired MR data in computer memory.

14. The computer readable storage medium of claim 13 wherein the set of instructions further causes the computer to define the FOV such that a frequency encoding axis is less in length than a phase encoding axis.

15. The computer readable storage medium of claim 13 wherein the set of instructions further causes the computer to acquire bilateral breast MR data with gradient recalled echo readout.

16. The computer readable storage medium of claim 13 wherein the set of instructions further causes the computer to acquire spinal MR data with spin echo readout.

17. The computer readable storage medium of claim 13 wherein the second direction is defined as extending along a width of a subject and the third direction is defined as extending along a thickness of the subject.

18. A breast imaging examination technique comprising:
   selecting an axial FOV sized to spatially include both breasts of a subject to be scanned;
   truncating the FOV in a frequency encoding direction along an anterior/posterior axis extending through a subject to be scanned such that the FOV is larger in a phase encoding direction than the frequency encoding direction; and
   acquiring and storing MR data from the truncated FOV.

19. A spinal imaging examination technique comprising:
   selecting an sagittal FOV sized to spatially include multiple spinal regions of a subject to be scanned;
   truncating the FOV in a frequency encoding direction along an anterior/posterior axis extending through a subject to be scanned such that the FOV is larger in a phase encoding direction than the frequency encoding direction; and
   acquiring and storing MR data from the truncated FOV.

* * * * *